United States Patent
Haringer et al.

(10) Patent No.: US 10,006,145 B2
(45) Date of Patent: Jun. 26, 2018

(54) LIQUID DOPING SYSTEMS AND METHODS FOR CONTROLLED DOPING OF SINGLE CRYSTAL SEMICONDUCTOR MATERIAL

(71) Applicant: MEMC Electronic Materials S.p.A., Novara (IT)

(72) Inventors: Stephan Haringer, Novara (IT); Armando Giannattasio, Novara (IT); Roberto Scala, Novara (IT); Luigi Bonanno, Novara (IT); Valentino Moser, Novara (IT)

(73) Assignee: Corner Star Limited, Kowloon (HK)

( * ) Notice: Subject to any disclaimer, the term of this patent is extended or adjusted under 35 U.S.C. 154(b) by 105 days.

(21) Appl. No.: 14/758,143

(22) PCT Filed: Dec. 31, 2013

(86) PCT No.: PCT/EP2013/078163
§ 371 (c)(1),
(2) Date: Jun. 26, 2015

(87) PCT Pub. No.: WO2014/102387
PCT Pub. Date: Jul. 3, 2014

(65) Prior Publication Data
US 2015/0354088 A1 Dec. 10, 2015

(30) Foreign Application Priority Data
Dec. 31, 2012 (IT) .............................. TO2012A1175

(51) Int. Cl.
*C30B 15/04* (2006.01)
*C30B 29/06* (2006.01)

(52) U.S. Cl.
CPC .............. *C30B 15/04* (2013.01); *C30B 29/06* (2013.01); *Y10T 117/1056* (2015.01)

(58) Field of Classification Search
CPC combination set(s) only.
See application file for complete search history.

(56) References Cited

U.S. PATENT DOCUMENTS 4,547,258 A   10/1985   Witter et al.
5,242,531 A    9/1993   Klingshirn et al.
(Continued)

FOREIGN PATENT DOCUMENTS

JP    S59156993 A    9/1984
JP    2005272265 A  10/2005
(Continued)

OTHER PUBLICATIONS

Machine translation of JP2012-066965 pulled Mar. 23, 2017.*
(Continued)

*Primary Examiner* — Duy Vu N Deo
*Assistant Examiner* — Erin F Bergner
(74) *Attorney, Agent, or Firm* — Armstrong Teasdale LLP

(57) ABSTRACT

A doping system for introducing liquid dopant into a melt of semiconductor or solar-grade material includes a dopant reservoir for holding dopant and a feeding tube. The dopant reservoir includes a body and a tapered end defining an opening having a smaller cross-sectional area than a cross-sectional area of the body. The feeding tube includes a first end extending from the opening of the reservoir, a second end distal from the first end, an angled tip disposed at the second end of the feeding tube, a first restriction for inhibiting the passage of solid dopant through the feeding tube, and a second restriction for controlling the flow of liquid dopant, the second restriction disposed near the second end of the feeding tube.

20 Claims, 7 Drawing Sheets

(56) References Cited

U.S. PATENT DOCUMENTS

| | | | |
|---|---|---|---|
| 5,866,094 A | | 2/1999 | Niikura |
| 5,902,395 A | * | 5/1999 | Nagai ..................... C30B 15/02 117/18 |
| 6,063,188 A | * | 5/2000 | Heid ....................... C30B 15/02 117/200 |
| 6,899,760 B2 | | 5/2005 | Choi et al. |
| 8,283,241 B2 | | 10/2012 | Narushima et al. |
| 2001/0015167 A1 | | 8/2001 | Weber et al. |
| 2010/0151667 A1 | | 6/2010 | Narushima et al. |

FOREIGN PATENT DOCUMENTS

| | | |
|---|---|---|
| JP | 2005336020 A | 12/2005 |
| JP | 2012066965 A | 4/2012 |
| TW | 201213626 A | 4/2012 |
| WO | 9428207 A1 | 12/1994 |
| WO | 2008149687 A1 | 12/2008 |

OTHER PUBLICATIONS

International Search Report and Written Opinion of the International Searching Authority regarding PCT/EP2013/078163 dated Feb. 17, 2014; pp. 11.

Examination Report and Written Opinion regarding Italian Patent Application No. TO20121175 dated Apr. 10, 2013; pp. 9.

Unofficial English Translation of First Office Action dated Jan. 9, 2017 regarding Chinese Patent Application No. 201380073899.3; pp. 1-10.

Unofficial English Translation of 1st Substantive Examination Report regarding Saudi Arabian Patent Application No. 515360706; pp. 1-9.

Unofficial English Translation of Office Action dated May 29, 2017, regarding Japanese Patent Application No. 2015-550113; pp. 1-8.

Office Action dated Jan. 9, 2018 issued in connection with Japanese Patent Application No. 2015-550113, and unofficial translation thereof; 6 pgs.

* cited by examiner

LIQUID DOPING SYSTEMS AND METHODS FOR CONTROLLED DOPING OF SINGLE CRYSTAL SEMICONDUCTOR MATERIAL

CROSS-REFERENCE TO RELATED APPLICATIONS

This application is a National Stage application of International Application No. PCT/EP2013/078163, filed on Dec. 31, 2013, which claims priority to Italian Application No. TO2012A001175 filed Dec. 31, 2012, the disclosures of which are hereby incorporated by reference in their entirety.

FIELD

The field relates generally to preparation of single crystals of semiconductor or solar-grade material and, more specifically, to a liquid doping system for controlled doping of a melt of semiconductor or solar-grade material.

BACKGROUND

Single crystal material, which is the starting material for fabricating many electronic components such as semiconductor devices and solar cells, is commonly prepared using the Czochralski ("Cz") method. Briefly, the Czochralski method involves melting polycrystalline source material such as polycrystalline silicon ("polysilicon") in a crucible to form a silicon melt and then pulling a single-crystal ingot from the melt.

During the process, precise amounts of dopants are added to the molten source material to modify the base resistivity of the resulting monocrystalline structure. Dopants are typically added to the molten source material in solid form, at least for p-type and n-type silicon. However, the use of solid dopants presents several drawbacks.

One drawback is a thermal shock resulting from the temperature difference between solid dopants and the molten source material. This thermal shock causes the molten source material to solidify underneath the solid dopant granules, creating "floating boats". Additionally, quartz particles can form during the formation of the floating boats. These quartz particles may remain in the molten source material long after the floating boats have melted, resulting in crystal defects, such as dislocations, in the final monocrystalline structure. A further drawback resulting from the addition of solid dopants to the molten source material is contamination of the monocrystalline growing assembly. The impact of solid dopants on the surface of the molten source material causes the molten source material to splash out of the crucible and onto various components of the monocrystalline growing assembly, which may result in crystal defects or damage to components in the assembly.

Yet another drawback to using solid dopants is that many have relatively high evaporation rates, such as indium. Placing these dopants directly into the crucible with the semiconductor or other solar-grade material prior to melting causes the dopant to evaporate during the heating of the semiconductor or solar-grade material. Additional dopant must be added to compensate for the lost dopant, often in significant quantities, resulting in an inefficient use of the dopant. Additionally, the evaporated dopant condenses on various components of the growing assembly, resulting in contamination of the assembly.

In view of the foregoing, it can be seen that a need exists for a simple, cost effective approach for introducing dopants into a melt of semiconductor or solar-grade material.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a doping system for introducing liquid dopant into a melt of semiconductor or solar-grade material is provided. The doping system includes a dopant reservoir for holding dopant and a feeding tube. The dopant reservoir includes a body and a tapered end defining an opening having a smaller cross-sectional area than a cross-sectional area of the body. The feeding tube includes first end extending from the opening of the reservoir, a second end distal from the first end, an angled tip disposed at the second end of the feeding tube, a first restriction for inhibiting the passage of solid dopant through the feeding tube, and a second restriction for controlling the flow of liquid dopant. The second restriction is disposed near the second end of the feeding tube.

In another aspect, a method for introducing liquid dopant into a melt of semiconductor or solar-grade material is described. The method includes positioning a doping system at a first location remote from the melt, adding a predetermined amount of solid dopant to the doping system, positioning the doping system at a second location, wherein the second location is sufficiently near a surface of the melt so that the solid dopant melts, melting the solid dopant such that the solid dopant becomes a liquid dopant, and introducing the liquid dopant into the melt through the feeding tube of the doping system. The doping system includes a dopant reservoir for holding dopant, a feeding tube, and a restriction for inhibiting the passage of solid dopant through the feeding tube. The dopant reservoir includes a body and a tapered end defining an opening having a smaller cross-sectional area than a cross-sectional area of the body. The feeding tube includes a first end extending from the opening of the reservoir, a second end distal from the first end, and an angled tip disposed at the second end of the feeding tube.

In yet another aspect, a crystal puller is provided. The crystal puller includes a crucible for holding a melt of semiconductor or solar-grade material, a heating element for heating the crucible and melting the semiconductor or solar-grade material, a doping system for introducing liquid dopant into the melt of semiconductor or solar-grade material, and a pulling mechanism for holding and positioning the doping system within the crystal puller. The doping system includes a dopant reservoir for holding dopant, a feeding tube, a first restriction for inhibiting the passage of solid dopant from the dopant reservoir through the feeding tube, and a second restriction for controlling the flow of liquid dopant. The pulling mechanism includes a dummy seed from which the doping system is suspended. The dopant reservoir includes a body and a tapered end defining an opening having a smaller cross-sectional area than a cross-sectional area of the body. The feeding tube includes a first end extending from the first opening of the reservoir, a second end distal from the first end, and an angled tip disposed at the second end of the feeding tube. The second restriction is disposed near the second end of the feeding tube.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols used in the various drawings indicate like elements.

DETAILED DESCRIPTION

Figure 1:
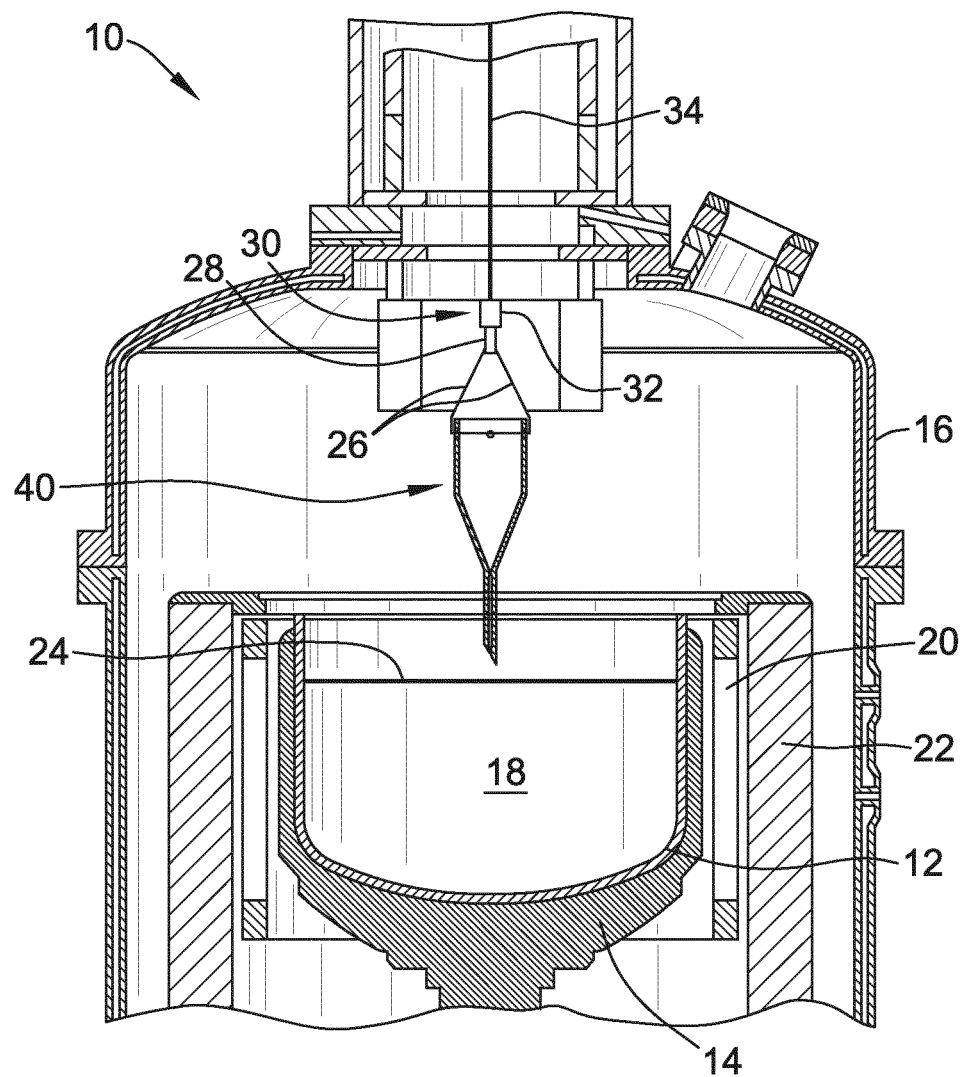
FIG. 1 is a cross-sectional view of a crystal puller including a doping system for introducing liquid dopant into a melt.

A crystal puller including a doping system for introducing liquid dopant into a melt of semiconductor or solar-grade material is indicated generally at 10 in FIG. 1. The crystal puller includes a crucible 12 for holding a melt 18 of semiconductor or solar-grade material, such as silicon, surrounded by a susceptor 14 contained within a furnace 16. The semiconductor or solar-grade material is melted by heat provided from a heating element 20 surrounded by insulation 22. A doping system (indicated generally at 40) for introducing liquid dopant into the melt 18 is positioned within the crystal puller 10. In operation, the doping system 40 is positioned near the melt surface 24 so that the heat from the melt surface 24 (and/or heating element 20) causes solid dopant (not shown in FIG. 1) within doping system 40 to melt and flow downwardly and out of doping system 40 into the melt 18.

The doping system 40 is suspended by cables or wires 26 from a dummy seed 28 attached to a pulling mechanism 30 for positioning the doping system 40 during the doping process described herein. The pulling mechanism 30 includes a chuck 32 for securing the dummy seed 28 to the pulling mechanism 30, and a shaft or pull wire 34 connected to the chuck 32 for raising and lowering the doping system 40. In the embodiment shown in FIG. 1, the cables or wires 26 are made from molybdenum or tungsten, although other materials may be used for cables or wires 26. The dummy seed 28 is made of stainless steel. Because the shape and size of the dummy seed 28 are the same as or similar to the shape and size of the seed already used in crystal pulling systems for growing monocrystalline ingots, the doping system 40 can be installed in crystal pulling systems already in use with little to no modification.

Figure 2:
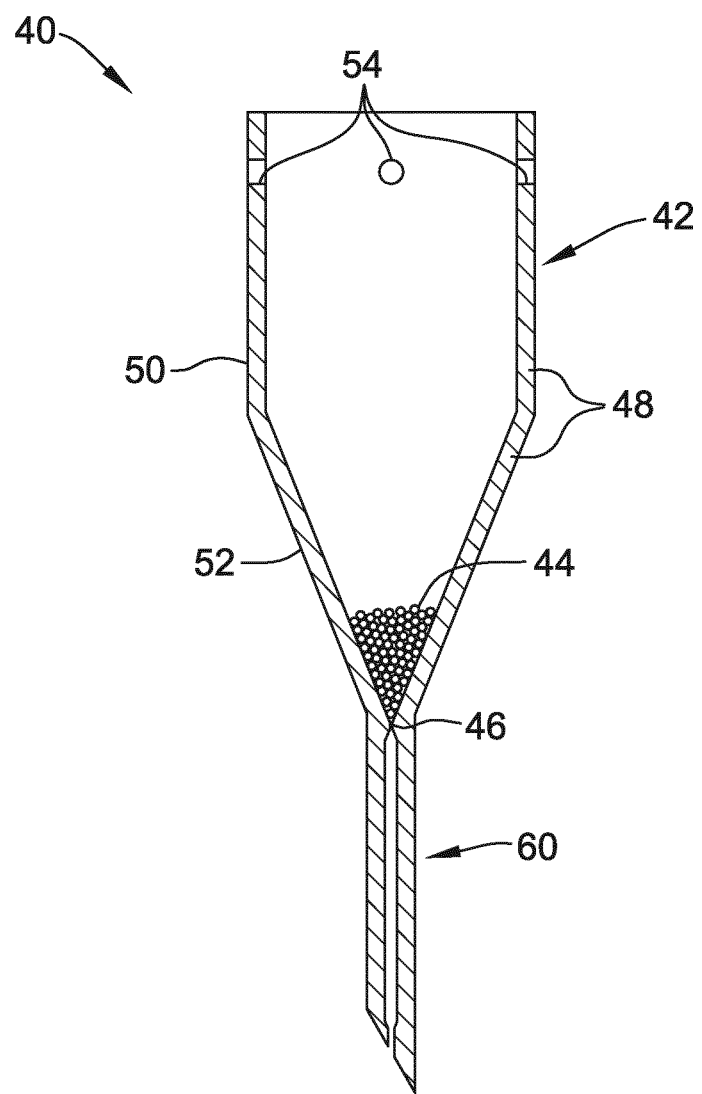
FIG. 2 is a cross-sectional view of the doping system of FIG. 1.

Referring to FIG. 2, a quartz doping system 40 includes a dopant reservoir 42 for holding dopant 44 and an elongated feeding tube 60 extending from a first, or upper, opening 46 in the dopant reservoir 42. Other materials suitable for high temperature applications may also be used for doping system (e.g., refractory ceramics, molybdenum, tungsten, and graphite), although quartz minimizes contamination from the doping system 40. In the embodiment shown in FIG. 2, the doping system 40 has a unitary construction. In other embodiments, the doping system 40 may be assembled from separate components. The dopant reservoir 42 includes quartz sidewalls 48 which define a generally cylindrical body 50 and a tapered end 52 defining the first opening 46 having a smaller cross-sectional area than the cross-sectional area of the body 50. The tapered end 52 has a conical shape to channel dopant to the lowest point of the dopant reservoir 42. In the embodiment shown in FIG. 2, the sidewalls 48 of tapered end 52 are linearly tapered, although the sidewalls 48 defining the tapered end 52 may also be curved inwardly such that tapered end 52 has a bowl-type shape. An end of the body 50 distal from the tapered end 52 includes holes 54, equally spaced around the circumference of body 50, through which cables or wires 26 are inserted to secure the doping system 40 to the pulling mechanism 30 for positioning the doping system 40 during the doping process described herein. The embodiment shown in FIG. 2 has four holes 54, although other embodiments may have a different number of holes 54.

Figure 3:
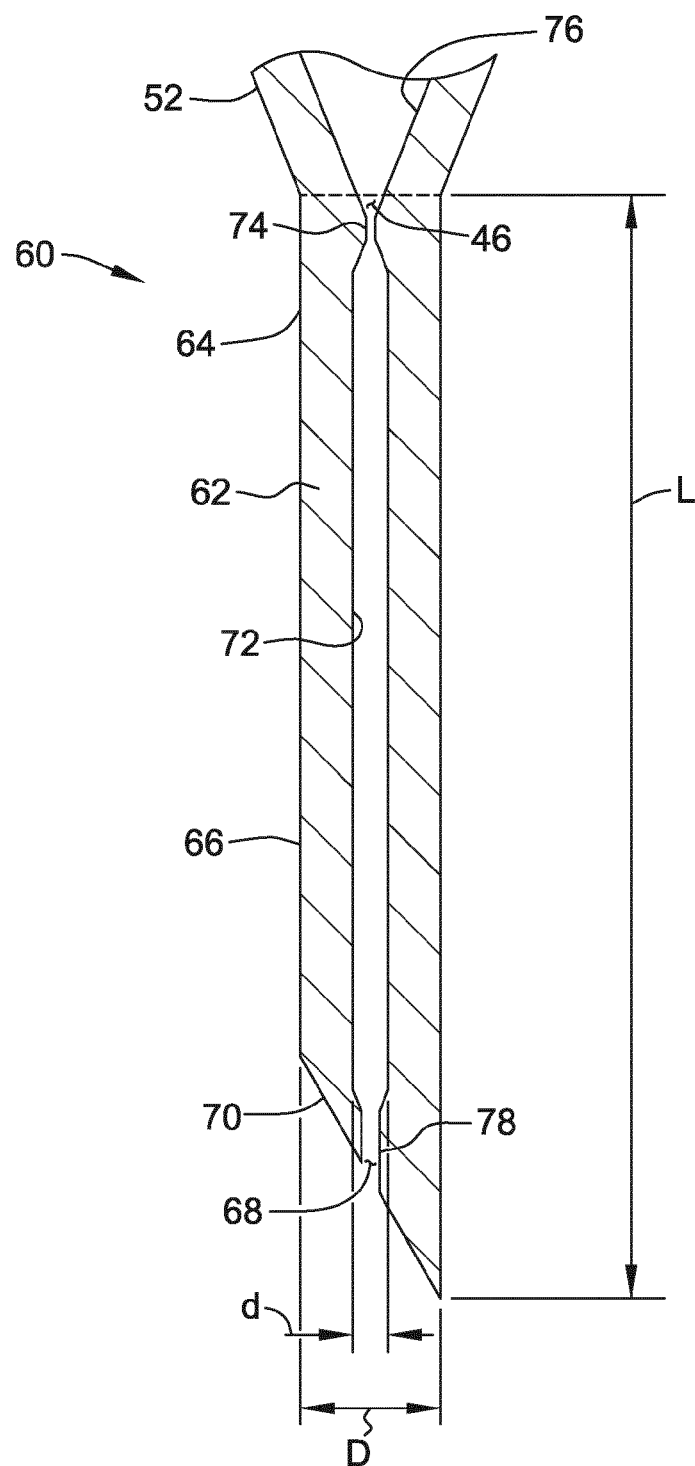
FIG. 3 is an enlarged view of the feeding tube of the doping system shown in FIG. 2.

Referring now to FIG. 3, the feeding tube 60 comprises sidewalls 62 extending from the upper opening 46 to a length L, and has a first, or upper, end 64 positioned near the upper opening 46, and a second, or lower, end 66 distal from the upper end 64, having a second, or lower, opening, 68 defined therein. An angled tip 70 is disposed at the lower end 66 of the feeding tube 60. The angled tip 70 provides a better visual indicator of contact between the lower end 66 of the feeding tube and the melt surface 24, compared to a non-angled tip. The angled tip 70 therefore aids the operator (not shown) in minimizing the contact between the melt 18 and the doping system 40.

As described in more detail below, during the doping process, the doping system is lowered towards the melt surface 24 until the angled tip 70 contacts the melt surface 24. The dopant reservoir 42 is thus positioned above the melt surface by a distance generally equal to the length L of the feeding tube 60. The length of the feeding tube L is selected so that during the doping operation, the dopant reservoir is positioned at a height H (shown in FIG. 6) above the melt surface 24 such that the temperature within the dopant reservoir is just above the melting temperature of the dopant 44, thereby limiting dopant evaporation.

The feeding tube 60 has an inner diameter d defined by inner sidewalls 72 of feeding tube 60, wherein the inner diameter d is sized such that when liquid dopant is passing through the feeding tube 60, the liquid dopant substantially occupies the volume enclosed by feeding tube 60. As a result, the free surface of the liquid dopant is minimized, thereby reducing evaporation of the liquid dopant. The inner diameter d of feeding tube d is also sized such that the capillary action does not prevent liquid dopant from passing through feeding tube 60. Because the capillary forces acting on the liquid dopant are inversely related to the temperature of the liquid dopant, the inner diameter d of the feeding tube 60 may be inwardly tapered towards the lower end 66 of the feeding tube 60.

The feeding tube 60 also has an outer diameter D based upon the thickness of the feeding tube sidewalls 62 and the size of the inner diameter d. In the embodiment shown in FIG. 2, the outer diameter D of feeding tube 60 is the same as the outer diameter of the tapered end 52 at the upper opening 46.

The inner sidewalls 72 of the feeding tube 60 extend inwardly near the opening 46 to form a first restriction 74 configured to restrict the passage of solid dopant 44 through the feeding tube 60. The first restriction 74 may alternatively be formed from the inner sidewalls 76 of the tapered end 52, or the first restriction 74 may span the feeding tube 60 and the tapered end 52. The first restriction 74 has a diameter sized to prevent the passage of solid dopant through the feeding tube 60. In the embodiment shown in FIG. 3, the first restriction has an inner diameter of 1 mm.

A second restriction 78 of this embodiment is formed near the lower end 66 of the feeding tube 60 to impede the flow of, and reduce the velocity of liquid dopant passing through feeding tube 60. By reducing the velocity of liquid dopant, the impact of the liquid dopant on the melt surface 24 is reduced, thereby reducing splashing or spattering of the melt 18. Further, impeding the flow of the liquid dopant in the lower end 66 of the feeding tube 60 causes the liquid dopant to be further heated prior to being introduced into the melt 18. Thus, the liquid dopant is heated to a temperature approaching the temperature of the melt 18 before being introduced into the melt 18. This reduces the thermal shock between the dopant 44 and the melt 18. Additionally, raising the temperature of the liquid dopant reduces the viscosity of the liquid dopant, thereby further reducing splashing or spattering of the melt 18 when liquid dopant is introduced.

The second restriction 78 also reduces the cross-sectional area of the liquid dopant stream exiting the feeding tube 60, and the resulting free surface area of the liquid dopant on the melt surface 24. By reducing the free surface area of the liquid dopant on the melt surface 24, the second restriction 78 further reduces evaporation of the liquid dopant.

In the embodiment shown in FIG. 3, the second restriction 78 has a similar configuration to the first restriction 74 in that the inner sidewalls 72 of the feeding tube 60 are inwardly tapered near the lower opening 68 to form the second restriction 78. The second restriction 78 extends downwardly to the end of feeding tube 60, defining the lower opening 68 of the feeding tube 60. The diameter of the second restriction 78 is sized smaller than the inner diameter d of the feeding tube 60, and large enough to permit liquid dopant to overcome the capillary forces acting on the liquid dopant from the inner sidewalls 72 of feeding tube 60. In the embodiment shown in FIG. 3, the diameter of the second restriction is 2 mm.

Figure 4:
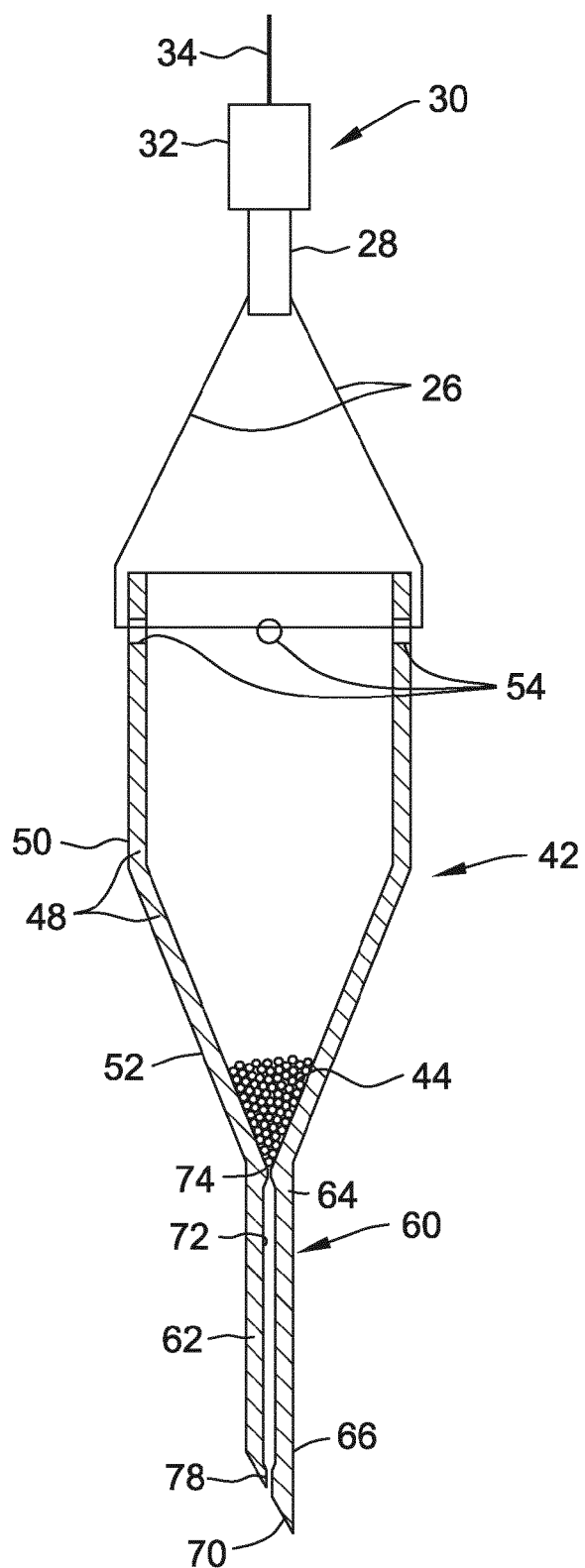
FIG. 4 is a cross-sectional view of the doping system of FIG. 1 filled with solid dopant.

Referring now to FIGS. 4-7, a method of using the doping system 40 to introduce liquid dopant into a melt of semiconductor or solar-grade material will now be described. As shown in FIG. 4, a predetermined amount of dopant particles 44 are introduced into dopant reservoir 42 while the doping system 40 is positioned remote from the melt surface 24. The tapered end 52 funnels the dopant particles 44 towards the lowest portion of the dopant reservoir 42. The first restriction 74 prevents solid dopant particles 44 from passing through feeding tube 60.

Figure 5:
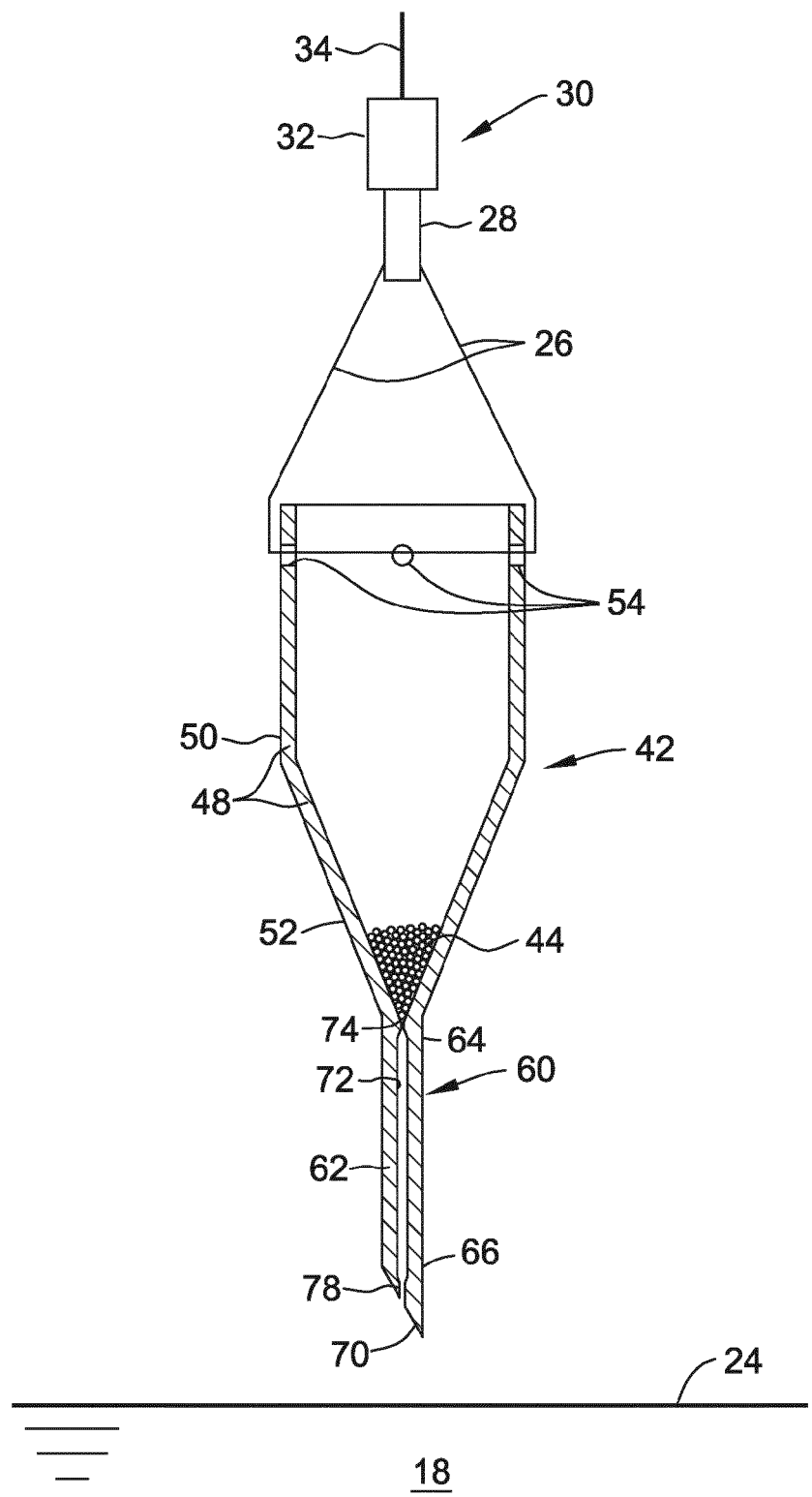
FIG. 5 is a cross-sectional view of the doping system of FIG. 4 being lowered towards a melt surface.
Figure 6:
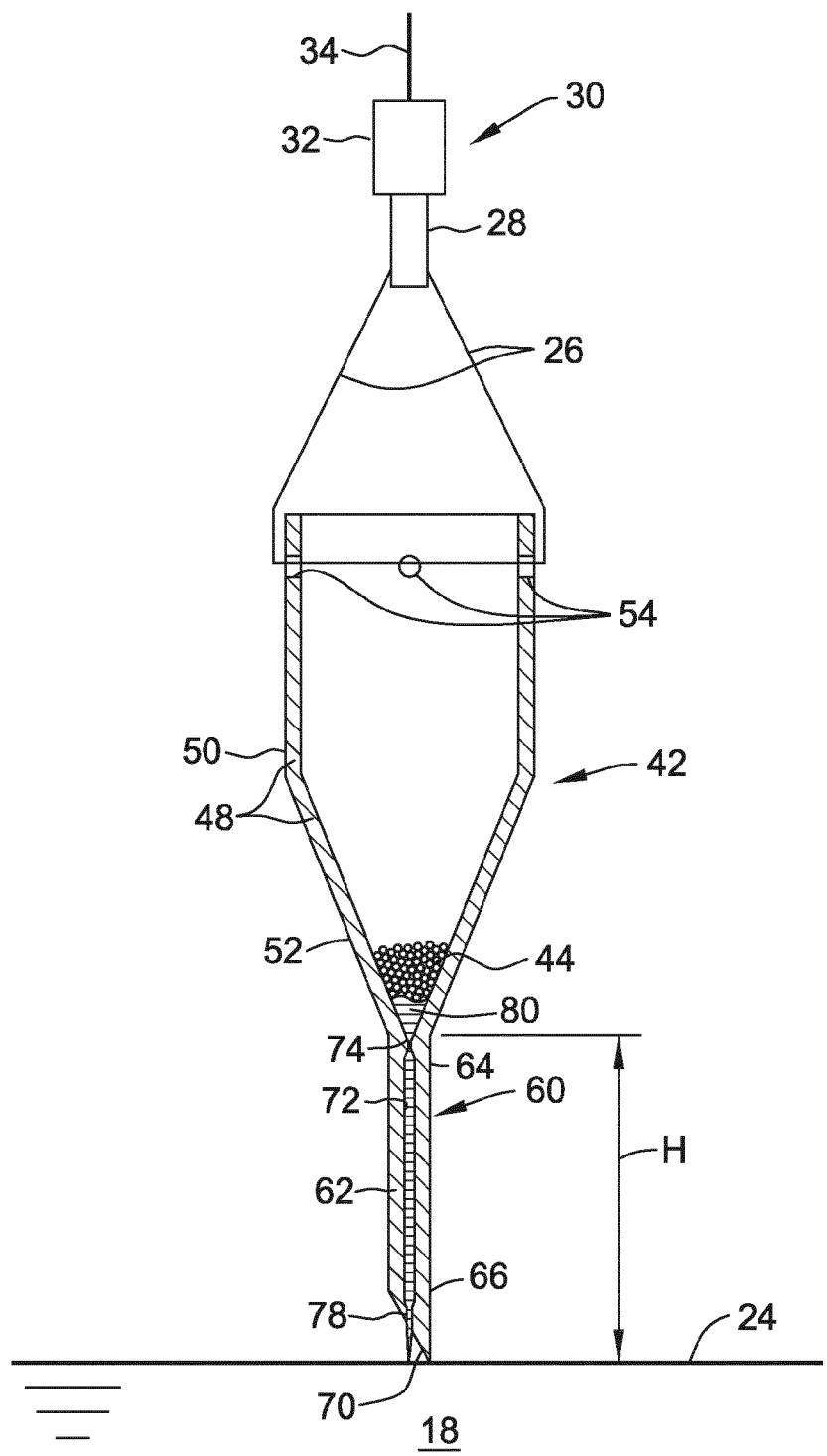
FIG. 6 is a cross-sectional view of the doping system of FIG. 4 positioned near the melt surface.

As shown in FIGS. 5-6, to introduce the dopant 44 into the melt 18, the doping system 40 is lowered near the melt surface 24 via pulling mechanism 30. The doping system 40 is lowered until the angled tip 70 of feeding tube 60 contacts the melt surface 24. The angled tip 70 of the feeding tube 60 facilitates positioning of the doping system 40 near the melt surface 24 by providing a better visual indicator of contact between the melt surface 24 and the feeding tube 60. Thus, the doping system 40 is configured to be positioned near the melt surface 24 and to minimize contact with the melt 18, which contact can cause gradual degradation of the doping system from thermal shock and deformation, solidification of the melt material around the feeding tube, and deposition on the feeding tube inner surface of silicon monoxide evaporating from the melt 18.

As the doping system 40 is lowered towards the melt surface 24, the temperature inside the dopant reservoir 42 begins to increase. To reduce the possibility of the dopant 44 melting before it is positioned near the melt surface 24, a move time is determined within which to position the doping system 40. The move time is based upon the amount of time needed to melt solid dopant particles 44, and can be estimated by the amount of time needed to raise the temperature of the solid dopant particles 44 to the melting point, or $$t_{move} = \frac{(T_m - T_s) * (c_d * m_d + c_{dd} * m_{dd})}{\frac{dE}{dt}}$$

where $T_m$ is the melting temperature of the dopant, $T_s$ is temperature of the solid dopant particles 44 at the beginning of the doping process (normally room temperature), $c_d$ is the specific heat capacity of the solid dopant particles 44, $m_d$ is the total mass of the solid dopant particles 44, $c_{dd}$ is the specific heat capacity of the doping system 40, $m_{dd}$ is the mass of the doping system 40, and $$\frac{dE}{dt}$$

is the rate of energy transfer from the melt 18 and other components of the crystal puller 10 to the solid dopant particles 44 and to the doping device 40. Positioning the doping system 40 near the melt surface 24 within the move time prevents liquid dopant from being released while doping system 40 is positioned remote from the melt surface 24, thereby preventing a violent impact of the liquid dopant on the melt surface 24. The angled tip 70 of feeding tube 60 reduces the amount of time needed to position the doping system 40 because it provides a better visual indication of contact between the melt surface 24 and the feeding tube 60. Thus, the angled tip 70 aids the operator (not shown) in positioning the doping system 40 within the move time.

Once doping system 40 is positioned near the melt surface 24, the temperature inside the dopant reservoir 42 increases to the melting temperature of dopant particles 44. As solid dopant particles 44 liquefy, the resulting liquid dopant 80 flows through first restriction 74 and feeding tube 60. The size of diameter d of feeding tube 60 limits the available free surface of the liquid dopant 80 as it flows through the feeding tube 60, thereby limiting evaporation of the liquid dopant 80.

Liquid dopant 80 flowing through feeding tube 60 is impeded by the second restriction 78 at the lower end 66 of feeding tube 60 before exiting feeding tube 60 through the lower opening 68 and entering the melt 18. The second restriction 78 impedes the flow of, and reduces the velocity of liquid dopant 80 passing through feeding tube 60, thereby reducing the impact of the liquid dopant 80 on the melt surface 24, and any splashing or spattering of the melt 18. Further, impeding the flow of the liquid dopant in the lower end 66 of the feeding tube 60 causes the liquid dopant 80 to be further heated prior to entering the melt 18. As a result, the temperature of the liquid dopant 80 can be heated to a temperature approaching the temperature of the melt 18 before entering the melt, thereby reducing thermal shock between the liquid dopant 80 and the melt 18. Additionally, raising the temperature of the liquid dopant 80 reduces the viscosity of the liquid dopant 80, thereby further reducing splashing or spattering of the melt 18 when liquid dopant 80 is introduced in to the melt 18.

The second restriction 78 also reduces the cross-sectional area of the liquid dopant 80 stream exiting the feeding tube 60, and the resulting free surface area of the liquid dopant 80 on the melt surface 24. By reducing the free surface area of the liquid dopant 80 on the melt surface 24, the second restriction 78 reduces evaporation of the liquid dopant 80.

Once dopant particles 44 have liquefied and/or a predetermined amount of time has elapsed, doping system 40 is raised by pulling mechanism 30 and removed from furnace 16. The doping process may then be repeated or the doping system 40 may be stored for later use.

Figure 7:
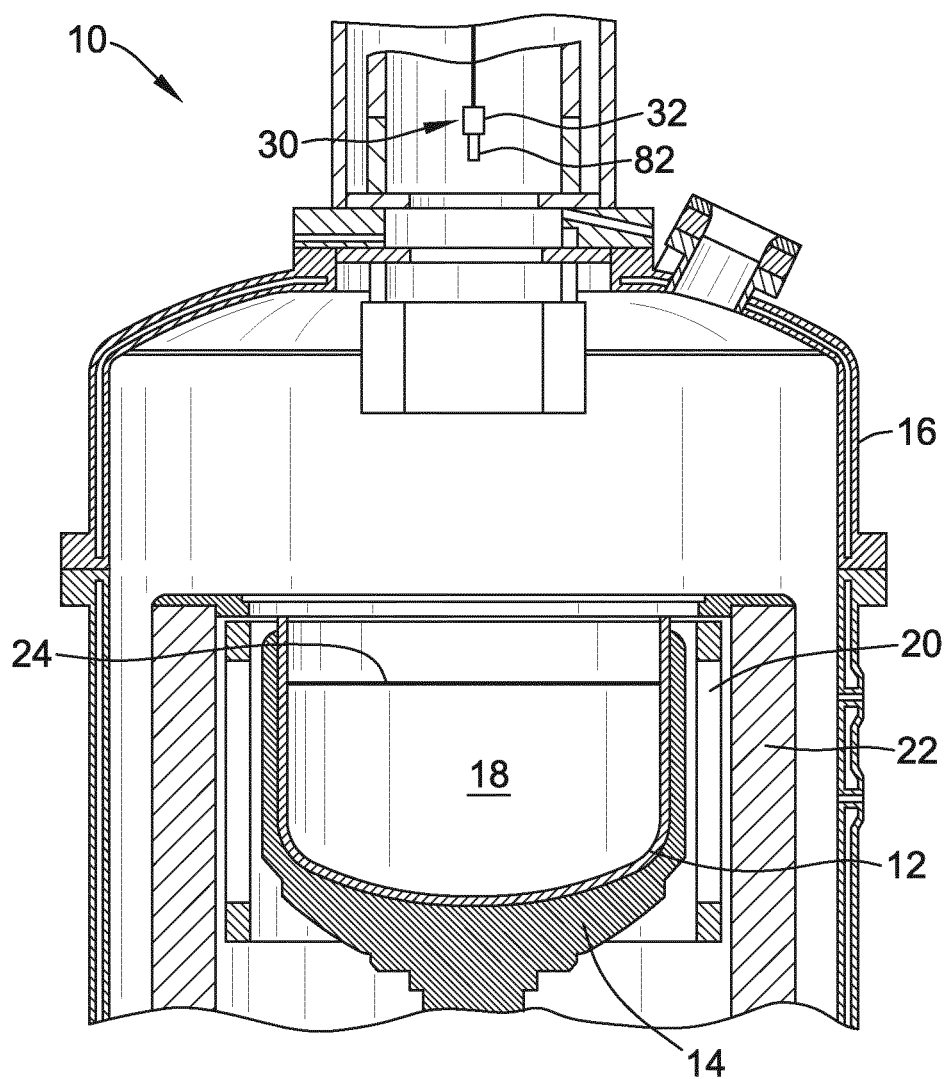
FIG. 7 is a cross-sectional view of the crystal puller of FIG. 1. with the doping system removed.

When dopant 44 has a relatively low melting point, e.g., less than 1400° C., or even less than 800° C., the doping method described above can be performed in a relatively short amount of time. As a result, the temperature of the body 50 of dopant reservoir 42 is low enough such that the doping system 40 can be removed from the furnace 16 immediately after the doping process is completed, without the need for a cooling step. Additionally, the dummy seed 28 can be immediately removed from the chuck 32 and replaced with a seed 82 for use in growing a monocrystalline ingot, as shown in FIG. 7.

The embodiments described herein generally relate to systems and methods for introducing liquid dopants with relatively low melting points and/or relatively high evaporation rates into a melt of semiconductor or solar-grade material. The embodiments described herein are particularly suited for use with dopants that undergo evaporation or sublimation at temperatures lower than that of silicon, for example, indium, antimony, gallium and aluminum.

As described above, doping systems of this disclosure and associated methods provide an improvement over known doping systems and methods. The doping system avoids the problems associated with directly adding solid dopants to a melt, namely loss of dopant to evaporation, floating boats, and splashing caused by dopant granules. Dopant evaporation is decreased with the doping system because the temperature of dopant is held just above the melting temperature until just before the dopant enters the melt. Additionally, the configuration of the doping system reduces the free surface of liquid dopant available for evaporation both within the doping system and once the dopant has been introduced into the melt.

Moreover, the doping system is designed to minimize the need for submerging the system into the melt, thus preventing degradation of the system.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

The invention claimed is:

1. A doping system for introducing liquid dopant into a melt of semiconductor or solar-grade material, the system comprising:

a dopant reservoir for holding dopant, the dopant reservoir suspended from a crystal pulling mechanism and including a body and a tapered end defining an opening having a smaller cross-sectional area than a cross-sectional area of the body; and a feeding tube having a first end extending from the opening of the reservoir, a second end distal from the first end, an angled tip disposed at the second end of the feeding tube, a first restriction for inhibiting the passage of solid dopant through the feeding tube, and a second restriction for controlling the flow of liquid dopant, the first restriction including an annular protrusion extending into the feeding tube, and the second restriction disposed near the second end of the feeding tube.

2. A doping system as set forth in claim 1, wherein a diameter of the second restriction is larger than a diameter of the first restriction.

3. A doping system as set forth in claim 1, wherein an outer diameter of the feeding tube is equal to or less than an outer diameter of the tapered end at the opening.

4. A doping system as set forth in claim 1, wherein the second restriction defines a second opening at the second end of the feeding tube.

5. A doping system as set forth in claim 1, further including granular dopant disposed in the reservoir.

6. A method for introducing liquid dopant into a melt of semiconductor or solar-grade material, the method comprising:

positioning a doping system at a first location remote from the melt, the doping system including a dopant reservoir for holding dopant, the dopant reservoir suspended from a crystal pulling mechanism and including a body and a tapered end defining an opening having a smaller cross-sectional area than a cross-sectional area of the body, and a feeding tube having a first end extending from the opening of the reservoir, a second end distal from the first end, and an angled tip disposed at the second end of the feeding tube, the feeding tube including a first restriction for inhibiting the passage of solid dopant through the feeding tube, and a second restriction for controlling the flow of liquid dopant, the first restriction including an annular protrusion extending into the feeding tube, and the second restriction disposed near the second end of the feeding tube;

adding a predetermined amount of solid dopant to the doping system;

positioning the doping system at a second location, wherein the second location is sufficiently near a surface of the melt so that the solid dopant melts;

melting the solid dopant such that the solid dopant becomes a liquid dopant; and introducing the liquid dopant into the melt through the feeding tube of the doping system.

7. A method as set forth in claim 6, wherein the crystal pulling mechanism includes a chuck and a dummy seed from which the doping system is suspended, and wherein positioning the doping system at the first and second locations includes using the crystal pulling mechanism to raise and lower the doping system.

8. A method as set forth in claim 7, further comprising:

removing the doping system from the second position to a third position remote from the melt; and replacing the dummy seed of the crystal pulling mechanism with a seed for use in growing a monocrystalline ingot.

9. A method as set forth in claim 6, wherein positioning the doping system at a second location comprises moving the doping system towards a surface of the melt of semiconductor or solar-grade material until the angled tip contacts the surface of the melt.

10. A method as set forth in claim 6, further comprising restricting the liquid dopant at the second end of the feeding tube and further heating the liquid dopant while the liquid dopant is within the feeding tube prior to introducing the liquid dopant into the melt.

11. A method as set forth in claim 6, wherein positioning the doping system at a second location comprises:
   determining a move time within which to move the doping system from the first location to the second location; and
   moving the doping system from the first location to the second location within the move time.

12. A method as set forth in claim 11, wherein the move time is based upon an amount of time needed to melt the solid dopant.

13. A method as set forth in claim 6, wherein the solid dopant is selected from the group consisting of elements having a melting point less than about 1400° C.

14. A method as set forth in claim 6, wherein the solid dopant is selected from the group consisting of antimony and indium.

15. A crystal puller comprising: a crucible for holding a melt of semiconductor or solar-grade material; a heating element for heating the crucible and melting the semiconductor or solar-grade material; a doping system for introducing liquid dopant into the melt of semiconductor or solar-grade material, the doping system including: a dopant reservoir for holding dopant, the dopant reservoir including a body and a tapered end defining an opening having a smaller cross-sectional area than a cross-sectional area of the body; a feeding tube having a first end extending from the first opening of the reservoir, a second end distal from the first end, and an angled tip disposed at the second end of the feeding tube; a first restriction for inhibiting the passage of solid dopant from the dopant reservoir through the feeding tube, the first restriction including an annular protrusion extending into the feeding tube; and a second restriction for controlling the flow of liquid dopant, the second restriction disposed near the second end of the feeding tube; and a pulling mechanism for holding and positioning the doping system within the crystal puller, the pulling mechanism including a dummy seed from which the doping system is suspended.

16. A crystal puller as set forth in claim 15, wherein the first restriction is disposed at the tapered end of the dopant reservoir.

17. A crystal puller as set forth in claim 15, wherein the first restriction is disposed within the first end of the feeding tube.

18. A crystal puller as set forth in claim 15, wherein a diameter of the second restriction is larger than a diameter of the first restriction.

19. A crystal puller as set forth in claim 15, wherein the second restriction is defined by an inner sidewall of the feeding tube.

20. A crystal puller as set forth in claim 15, wherein the length of the feeding tube is based upon a predetermined height at which the doping system is to be positioned above a surface of the melt during the introduction of liquid dopant into the melt.

* * * * *